(12) United States Patent
Obata et al.

(10) Patent No.: US 11,611,349 B2
(45) Date of Patent: Mar. 21, 2023

(54) ANALOG-TO-DIGITAL CONVERTER, SENSOR SYSTEM, AND TEST SYSTEM

(71) Applicant: Panasonic Intellectual Property Management Co., Ltd., Osaka (JP)

(72) Inventors: Koji Obata, Osaka (JP); Jun'ichi Naka, Osaka (JP); Junji Nakatsuka, Osaka (JP); Hiroki Yoshino, Nara (JP); Masaaki Nagai, Osaka (JP)

(73) Assignee: PANASONIC INTELLECTUAL PROPERTY MANAGEMENT CO., LTD., Osaka (JP)

( * ) Notice: Subject to any disclaimer, the term of this patent is extended or adjusted under 35 U.S.C. 154(b) by 118 days.

(21) Appl. No.: 17/427,060

(22) PCT Filed: Mar. 13, 2020

(86) PCT No.: PCT/JP2020/011111
§ 371 (c)(1),
(2) Date: Jul. 29, 2021

(87) PCT Pub. No.: WO2020/195955
PCT Pub. Date: Oct. 1, 2020

(65) Prior Publication Data
US 2022/0123758 A1    Apr. 21, 2022

(30) Foreign Application Priority Data
Mar. 28, 2019 (JP) .............................. JP2019-065096

(51) Int. Cl.
*H03M 1/10* (2006.01)
*H03M 1/46* (2006.01)
(Continued)

(52) U.S. Cl.
CPC ......... *H03M 1/1071* (2013.01); *H03M 1/466* (2013.01); *H03M 3/46* (2013.01); *G01R 19/2509* (2013.01)

(58) Field of Classification Search
CPC ...... H03M 1/1071; H03M 3/46; H03M 1/466; G01R 19/2509; G01R 31/2829
(Continued)

(56) References Cited

U.S. PATENT DOCUMENTS 7,236,113 B1 * 6/2007 Wang ..................... G01L 9/12
341/150
10,439,635 B1 * 10/2019 Tang ..................... G01K 7/015

FOREIGN PATENT DOCUMENTS

JP          5561453 B        7/2014
JP          2017-147712      8/2017

OTHER PUBLICATIONS

International Search Report of PCT application No. PCT/JP2020/011111 dated Jun. 2, 2020.

* cited by examiner

*Primary Examiner* — Khai M Nguyen
(74) *Attorney, Agent, or Firm* — McDermott Will & Emery LLP

(57) ABSTRACT

Provided are an analog-to-digital (AD) converter, a sensor system, and a test system capable of reducing the time for test processing. AD converter includes input part, AD conversion part, first output part, and second output part. The analog signal output from sensor is input to input part. AD conversion part digitally converts an analog signal to generate first digital data and second digital data. First output part outputs the first digital data to control circuit. Second output part outputs the second digital data to test controller before first output part outputs the first digital data. In the
(Continued)

test mode, test controller determines whether or not sensor system including sensor is in an abnormal state on the basis of the second digital data.

9 Claims, 3 Drawing Sheets

(51) Int. Cl.
*H03M 3/00* (2006.01)
*G01R 19/25* (2006.01)

(58) Field of Classification Search
USPC .......................................... 341/120, 143, 155
See application file for complete search history.

ANALOG-TO-DIGITAL CONVERTER, SENSOR SYSTEM, AND TEST SYSTEM

FIELD OF THE INVENTION

The present disclosure generally relates to an analog-to-digital converter (AD converter), a sensor system using the same, and a test system, and more particularly to an AD converter that digitally converts an analog signal, a sensor system using the same, and a test system.

DESCRIPTION OF THE RELATED ART

Conventionally, a noise shaping type successive approximation AD converter (AD converter) that achieves high resolution such as a $\Delta\Sigma$ type AD converter while maintaining low power consumption of the successive approximation type AD converter is known (see, for example, PTL 1).

The noise shaping type successive approximation AD converter of PTL 1 has a configuration in which an integration circuit is added to a normal successive approximation type AD converter. In the noise shaping type successive approximation AD converter of PTL 1, the noise shaping characteristic is obtained in the output data by integrating the residual voltage of the capacitive DAC (digital-to-analog converter) after performing the successive approximation operation up to the LSB (least significant bit) and feeding back the integrated residual voltage to the next sampling.

CITATION LIST

Patent Literature

PTL 1: Unexamined Japanese Patent Publication No. 2017-147712

SUMMARY OF THE INVENTION

In the AD converter, in order to increase the resolution of the output data, it takes time to perform a digital conversion process of a digital filter or the like of the noise shaping type AD converter, and thus the latency increases. Therefore, in a case of performing test processing of determining whether or not a sensor system is in an abnormal state using output data of the AD converter, there is a possibility that the time of the test processing becomes long.

The present disclosure has been made in view of the above circumstances, and an object of the present disclosure is to provide an AD converter capable of reducing the time for test processing, a sensor system using the same, and a test system.

The AD converter according to one aspect of the present disclosure includes an input part, an AD conversion part, a first output part, and a second output part. The input part receives an analog signal output from a sensor. The AD conversion part digitally converts the analog signal to generate first digital data and second digital data. The first output part outputs the first digital data to a control circuit. The second output part outputs the second digital data to the test controller before the first output part outputs the first digital data. In a test mode, the test controller determines whether or not the sensor system including the sensor is in an abnormal state based on the second digital data.

A sensor system according to one aspect of the present disclosure includes the AD converter according to one aspect of the present disclosure, and the sensor.

A test system according to one aspect of the present disclosure includes the sensor system according to one aspect of the present disclosure, and the test controller.

In the present disclosure, there is an effect that the time of the test processing can be reduced.

DETAILED DESCRIPTION OF THE PREFERRED EMBODIMENTS

An exemplary embodiment and modifications described below are merely examples of the present disclosure, and the present disclosure is not limited to the exemplary embodiment and modifications. Even in a case other than this exemplary embodiment and the modification, various modifications can be made according to the design and the like without departing from the technical idea of the present disclosure.

Exemplary Embodiment (1) Configuration

Figure 1:
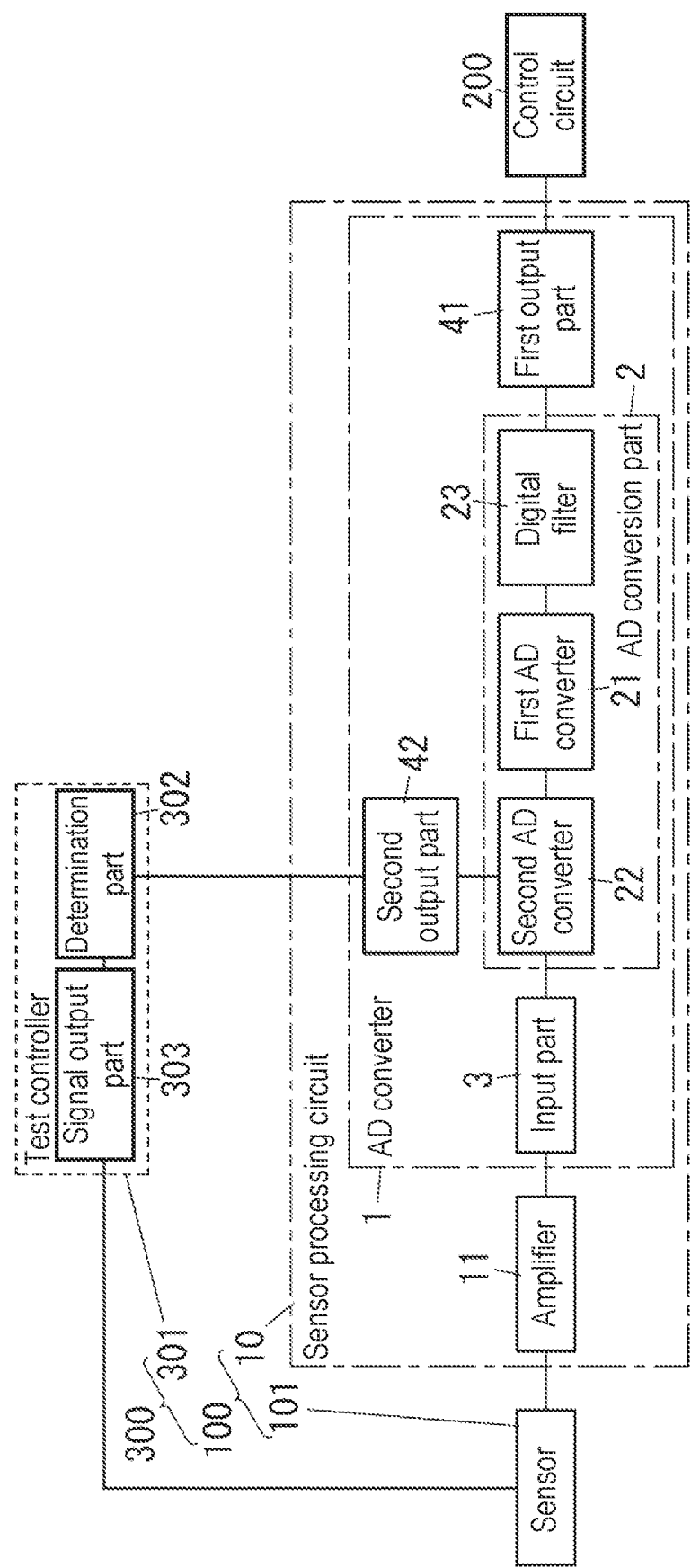
FIG. 1 is a block diagram of a sensor system including an AD converter and a test system according to an exemplary embodiment of the present disclosure.

FIG. 1 shows a block diagram of sensor system 100 including AD converter 1 (AD: Analog to Digital) according to the present exemplary embodiment, and test system 300.

AD converter 1 of the present exemplary embodiment is used for an analog front end (sensor processing circuit 10) of sensor system 100, and is configured to digitally convert an analog signal from sensor 101.

Sensor processing circuit 10 includes AD converter 1 and amplifier 11, processes a signal from sensor 101, and outputs the processed signal to control circuit 200.

Sensor system 100 includes sensor 101 and sensor processing circuit 10.

Test system 300 includes sensor system 100 and test controller 301. Test controller 301 determines whether or not sensor system 100 is in an abnormal state on the basis of the output data of AD converter 1.

Sensor 101 is configured to detect a physical quantity of a measurement target or a change amount of the measurement target. Sensor 101 outputs an analog signal including a change in a voltage value or a capacitance value of a capacitor according to the detection result to sensor processing circuit 10. That is, sensor 101 functions as a signal output part that outputs an analog signal. Sensor processing circuit 10 digitally converts the analog signal output from sensor 101 and outputs the converted signal to control circuit 200.

In the present exemplary embodiment, as an example, sensor system 100 is applied to a moving object such as an automobile. Sensor 101 is an acceleration sensor that detects acceleration of a moving object as a measurement target. Control circuit 200 that receives the detection result of sensor 101 is an electronic control unit (ECU) mounted on an automobile. Note that these are examples, and sensor 101 is not limited to the acceleration sensor, and may be a gyro sensor, a pressure sensor, a motion sensor, or the like. Furthermore, sensor system 100 may be applied to a device different from a moving object such as an automobile.

Sensor processing circuit 10 is an analog front end that processes an analog signal from sensor 101 and outputs the processed signal to control circuit 200.

Sensor processing circuit 10 includes AD converter 1 and amplifier 11.

Amplifier 11 is configured to amplify the analog signal from sensor 101. The analog signal output from sensor 101 is input to amplifier 11. In a case where the input analog signal is a voltage, amplifier 11 amplifies the amplitude at a predetermined amplification factor, or in a case where the analog signal is a change in capacitance value, the amplifier converts the change in capacitance value into a change in voltage or current, then amplifies the change at a predetermined amplification factor, and outputs the result to AD converter 1 connected to the subsequent stage.

AD converter 1 includes AD conversion part 2, input part 3, first output part 41, and second output part 42, converts the amplitude of the analog signal into digital data of a predetermined bit number, and outputs the digital data to control circuit 200 and test controller 301. In the present exemplary embodiment, as an example, AD converter 1 is configured to output 21-bit digital data (first digital data) to control circuit 200 and output 9-bit digital data (second digital data) to test controller 301. Note that the number of bits of the first digital data and the second digital data is an example, and is not limited to this value.

Input part 3 is electrically connected to amplifier 11. The analog signal output from sensor 101 is input to input part 3 via amplifier 11.

AD conversion part 2 includes first AD converter 21, second AD converter 22, and digital filter 23. First AD converter 21 and second AD converter 22 are connected in cascade (serial connection), and second AD converter 22 is provided at a preceding stage of first AD converter 21.

Second AD converter 22 is a successive approximation type AD converter (SAR: Successive Approximation Register). Second AD converter 22 includes a capacitive DA converter (DA: Digital to Analog). The capacitive DA converter includes a plurality of capacitors (capacitive elements). Each capacitor has one end electrically connected to input part 3 and the other end selectively electrically connected to one of a first voltage source and a second voltage source. The first voltage source and the second voltage source have different output voltages.

Second AD converter 22 sequentially repeats the comparison operation between the amplitude voltage of the analog signal and the voltage generated by the capacitive DA converter, thereby generating multi-bit digital data (second digital data). Specifically, AD conversion part 2 includes a comparator and a successive approximation control circuit. The comparator compares the input voltage (amplitude of the analog signal) input to input part 3 with a comparison reference voltage. Then, the successive approximation control circuit generates a successive approximation control signal of the next bit on the basis of the comparison result of the comparator and outputs the successive approximation control signal to the capacitive DA converter. The other end of each capacitor of the capacitive DA converter is selectively electrically connected to one of the first voltage source and the second voltage source according to the successive approximation control signal. Second AD converter 22 generates multi-bit digital data by repeating this successive approximation operation. In the present exemplary embodiment, as an example, second AD converter 22 generates 9-bit second digital data.

First AD converter 21 is a ΔΣ type AD converter. First AD converter 21 includes a subtracter, an integrator, a quantizer, and a DA converter, and performs ΔΣ modulation. The subtracter is a differential amplifier, and receives a residual voltage (corresponding to quantization noise) of the capacitive DA converter after the successive approximation operation in second AD converter 22 is performed and a reference signal. The subtracter subtracts the reference signal from the residual voltage. The integrator cumulatively adds calculation results in the subtracter. The quantizer compares a calculation result of the integrator with the reference signal to determine a 1-bit digital value. The result of the quantizer is output to digital filter 23 and the DA converter in the subsequent stage. The DA converter is a 1-bit DA converter, and determines a reference signal to be fed back and output to the subtracter on the basis of a result of the quantizer.

Note that first AD converter 21 may be a high-order ΔΣ type AD converter including a plurality of subtracters and integrators. The higher the order, the more the quantization noise can be transferred to the high frequency side, and the conversion accuracy can be improved.

Digital filter 23 filters the output of first AD converter 21. Digital filter 23 has a band limiting function and a decimation (thinning) function as filter processing. The output of first AD converter 21, which is a ΔΣ AD converter, includes high frequency noise due to noise shaping of quantization noise, and the data rate is higher than the original sampling frequency due to oversampling. Therefore, digital filter 23 reduces high-frequency noise by the band limiting function and reduces the data rate by the decimation function. Digital filter 23 generates multi-bit digital data by filtering the 1-bit output of first AD converter 21. In the present exemplary embodiment, as an example, digital filter 23 generates 21-bit digital data (first digital data) in which 9-bit second digital data generated by second AD converter 22 is used as high-order bits by filtering the output of first AD converter 21.

First output part 41 has an output port for outputting 21-bit first digital data generated by digital filter 23. First output part 41 outputs the first digital data to control circuit 200. Control circuit 200 controls an external device to be controlled on the basis of the first digital data obtained by digitally converting the analog signal output from sensor 101.

Second output part 42 has an output port for outputting the 9-bit second digital data generated by second AD converter 22. Second output part 42 outputs the second digital data to test controller 301.

Test controller 301 determines whether or not sensor system 100 is in an abnormal state on the basis of the second digital data. Specifically, test controller 301 includes determination part 302 and signal output part 303. Test controller 301 has a test mode as an operation mode. In a case where the operation mode is the test mode, test controller 301 transmits a test signal from signal output part 303 to sensor 101. When receiving the test signal, sensor 101 outputs an analog signal having an amplitude corresponding to the test signal. The analog signal output from sensor 101 is AD-converted into second digital data in AD converter 1 and is output to determination part 302. Determination part 302 determines whether or not sensor system 100 is in an abnormal state by comparing the received second digital data with a reference value (reference range) corresponding to the test signal output from signal output part 303. When sensor 101 and AD converter 1 are in the normal state, the second digital data corresponding to the test signal is output to test controller 301. When at least one of sensor 101 and AD converter 1 is in an abnormal state, the second digital data has a value deviating from the reference value (reference range). In this case, determination part 302 determines that sensor system 100 is in an abnormal state.

Here, the first digital data is generated by ΔΣ modulation by first AD converter 21 and a filtering process by digital filter 23 after second AD converter 22 completes generation of the 9-bit second digital data. That is, after the second digital data is generated, the first digital data is generated. Therefore, second output part 42 outputs the second digital data to test controller 301 before first output part 41 outputs the first digital data. That is, the latency (delay time) of the second digital data is smaller than that of the first digital data.

Note that sensor system 100 may be tested with a test signal superimposed on sensor 101 during normal operation instead of in an independent test mode.

(Operation Example)

Figure 2:
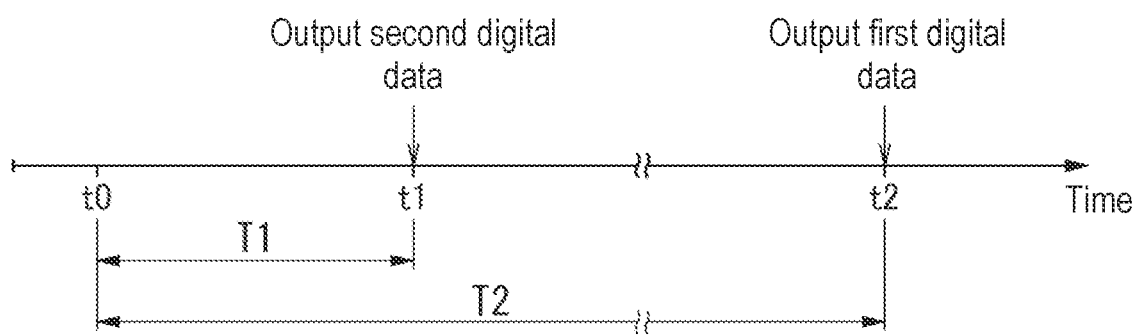
FIG. 2 is an operation explanatory diagram of the AD converter.

An operation example of AD converter 1 of the present exemplary embodiment will be described with reference to FIG. 2.

Here, AD conversion processing for the amplitude of the analog signal output from sensor 101 that has received the test signal to input part 3 at time t0 will be described.

Second AD converter 22 of AD conversion part 2 repeats the successive approximation operation. At time point t1, second AD converter 22 completes the generation of the 9-bit second digital data. Second output part 42 outputs the 9-bit second digital data generated by second AD converter 22 to test controller 301. Note that, strictly speaking, a time difference due to signal processing or the like of second output part 42 occurs between the generation of the second digital data by second AD converter 22 and the output of the second digital data by second output part 42. However, the time difference is little, and thus ignored here.

In addition, at time point t1, first AD converter 21 starts ΔΣ modulation. Further, digital filter 23 starts filtering the output of first AD converter 21.

At time point t2, digital filter 23 completes the filtering process. That is, the generation of the 21-bit first digital data having the 9-bit second digital data generated by second AD converter 22 as the high-order bits is completed. First output part 41 outputs the generated 21-bit first digital data to control circuit 200. Note that, strictly speaking, a time difference due to signal processing or the like of first output part 41 occurs between the generation of the first digital data by digital filter 23 and the output of the first digital data by first output part 41. However, the time difference is little, and thus ignored here.

As described above, AD converter 1 of the present exemplary embodiment outputs the second digital data to test controller 301 before outputting the first digital data to control circuit 200. The second digital data has lower resolution (number of bits) than the first digital data, but has lower latency. That is, since AD converter 1 of the present exemplary embodiment can output the first digital data having high resolution and the second digital data having low latency, it is possible to achieve both high resolution and low latency of the output data.

In the present exemplary embodiment, AD converter 1 outputs the first digital data having high resolution to control circuit 200, and outputs the second digital data having low latency to test controller 301. Therefore, since control circuit 200 can control the external device to be controlled on the basis of the first digital data having high resolution, it is possible to achieve high accuracy of control with respect to the external device. In addition, since the second digital data having low latency is input to test controller 301, it is possible to reduce the time for the test processing as to whether or not sensor system 100 is in an abnormal state.

In the present exemplary embodiment, first AD converter 21 and second AD converter 22 are connected in series, and the second digital data used for the test processing corresponds to the high-order bits of the first digital data output to control circuit 200. Therefore, in the test processing by test controller 301, it can be determined whether or not second AD converter 22 is normal.

MODIFICATIONS

Hereinafter, modifications of AD converter 1 of the present exemplary embodiment will be described.

First Modification

AD converter 1 according to a first modification will be described with reference to FIG. 3.

Note that the same reference numerals are given to the same configurations as those of AD converter 1 of the above-described exemplary embodiment, and the description thereof will be appropriately omitted.

In the example described above, AD converter 1 is an AD converter in which AD conversion part 2 includes a plurality of AD converters, but the present invention is not limited thereto.

Figure 3:
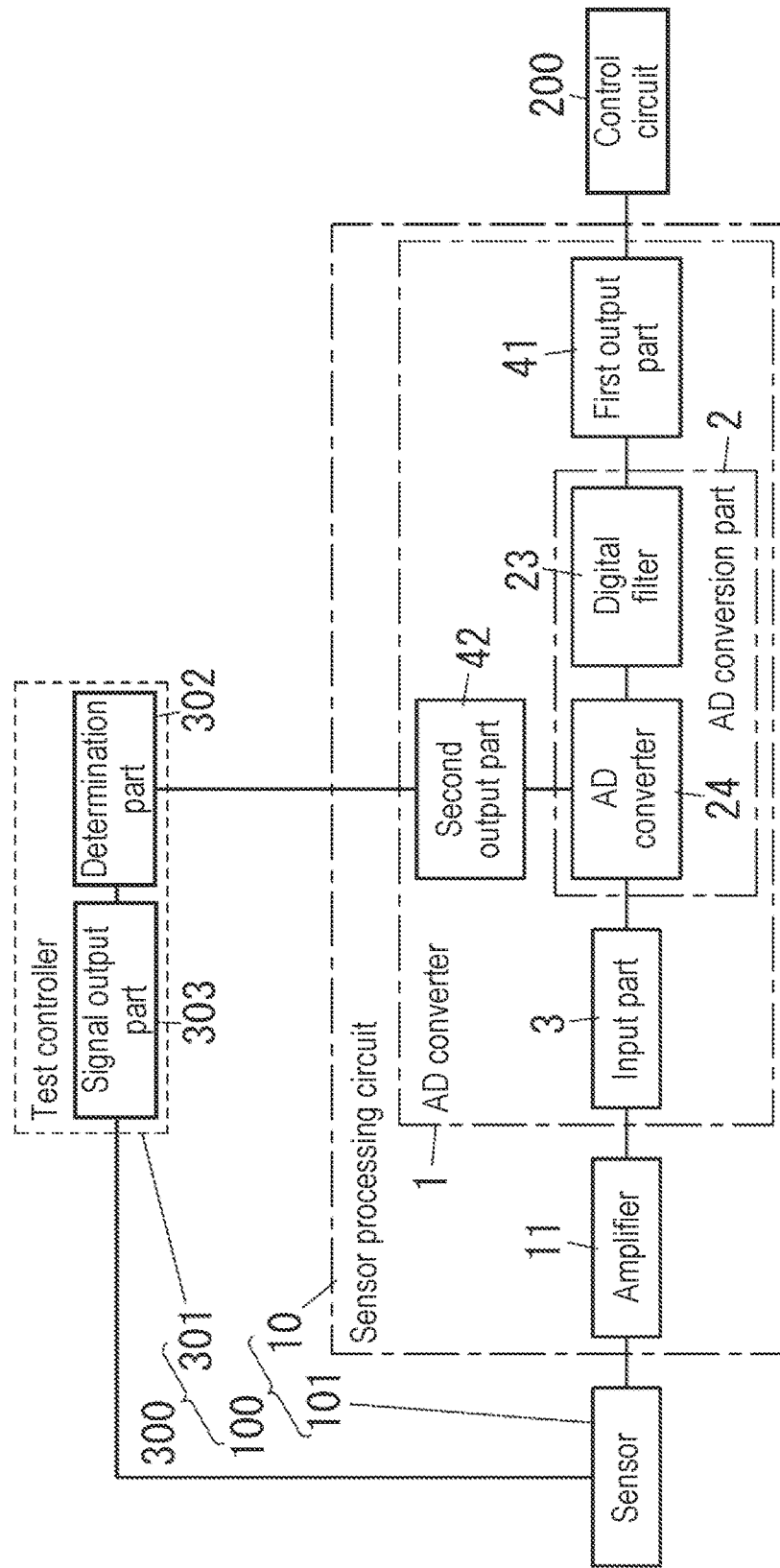
FIG. 3 is a block diagram of a sensor system including an AD converter according to a first modification and a second modification of the exemplary embodiment of the present disclosure, and a test system.

As illustrated in FIG. 3, AD conversion part 2 may include single AD converter 24. AD converter 24 of the present modification is a noise shaping type successive approximation AD converter. Above-described first AD converter 21 (see FIG. 1) is a single-bit ΔΣ AD converter, and is configured to generate 1-bit digital data by ΔΣ modulation and output the 1-bit digital data to digital filter 23. On the other hand, AD converter 24 generates digital data having noise shaping characteristics of multiple bits (for example, 9 bits). AD converter 24 outputs the generated 9-bit digital data as second digital data to second output part 42 and digital filter 23 in the subsequent stage.

Second output part 42 outputs the second digital data generated by AD converter 24 to test controller 301.

Digital filter 23 generates 21-bit digital data (first digital data) by filtering the 9-bit digital data (second digital data) generated by AD converter 24. First output part 41 outputs the first digital data generated by digital filter 23 to control circuit 200.

That is, in the present modification, second output part 42 outputs the second digital data before the filtering process by digital filter 23 to test controller 301. Therefore, second output part 42 can output the second digital data to test controller 301 before first output part 41 outputs the first digital data. That is, the latency (delay time) of the second digital data is smaller than that of the first digital data.

Second Modification

AD converter 1 according to a second modification will be described with reference to FIG. 3.

Note that the same reference numerals are given to the same configurations as those of AD converter 1 of the above-described exemplary embodiment, and the description thereof will be appropriately omitted.

In the example described above, AD converter 1 is an AD converter in which AD conversion part 2 includes a plurality of AD converters, but the present invention is not limited thereto.

As illustrated in FIG. 3, AD conversion part 2 may include single AD converter 24. AD converter 24 of the present modification is a multi-bit ΔΣ type AD converter. Above-described first AD converter 21 (see FIG. 1) is a single-bit ΔΣ AD converter, and is configured to generate 1-bit digital data by ΔΣ modulation and output the 1-bit digital data to digital filter 23. On the other hand, AD converter 24 generates multi-bit (for example, 4-bit) digital data by ΔΣ modulation. AD converter 24 outputs the generated 4-bit digital data as second digital data to second output part 42 and digital filter 23 in the subsequent stage.

Second output part 42 outputs the second digital data generated by AD converter 24 to test controller 301.

Digital filter 23 generates 21-bit digital data (first digital data) by filtering the 4-bit digital data (second digital data) generated by AD converter 24. First output part 41 outputs the first digital data generated by digital filter 23 to control circuit 200.

That is, in the present modification, second output part 42 outputs the second digital data before the filtering process by digital filter 23 to test controller 301. Therefore, second output part 42 can output the second digital data to test controller 301 before first output part 41 outputs the first digital data. That is, the latency (delay time) of the second digital data is smaller than that of the first digital data.

Other Modifications

In the example described above, second AD converter 22 (see FIG. 1) is a successive approximation type AD converter, but is not limited thereto, and may be an AD converter of another AD conversion architecture. For example, second AD converter 22 may be a flash type AD converter.

The flash type AD converter includes a plurality of resistors and a plurality of comparators. The plurality of resistors are connected in series between a reference power supply that outputs a reference voltage and a circuit ground, and generate a plurality of reference voltage divisions obtained by dividing the reference voltage into a plurality of voltages. The plurality of reference voltage divisions and the plurality of comparators correspond one-to-one. Each comparator compares the corresponding reference voltage division with the amplitude of the analog signal input to input part 3. The flash type AD converter generates the second digital data on the basis of the output of each comparator. The flash type AD converter can reduce the time required for the digital conversion process as compared with the successive approximation type AD converter.

Note that second AD converter 22 may be an AD converter having an AD conversion architecture different from those of the successive approximation type AD converter and the flash type AD converter. For example, second AD converter 22 may be a pipeline type AD converter, a single-slope type AD converter, a double integration type AD converter, a TDC type AD converter (TDC: Time to Digital Converter), a cyclic type AD converter, an incremental type AD converter, or the like. Further, second AD converter 22 may be a ΔΣ type AD converter having the same AD conversion architecture as first AD converter 21.

Further, first AD converter 21 may be a successive approximation type AD converter, a flash type AD converter, a pipeline type AD converter, a single-slope type AD converter, a double integration type AD converter, a TDC type AD converter, a cyclic type AD converter, an incremental type AD converter, or the like.

In the example described above, first AD converter 21 and second AD converter 22 are connected in series, but first AD converter 21 and second AD converter 22 may be connected in parallel.

Further, a number of AD converters included in AD conversion part 2 is not limited to two, and may be three or more.

Furthermore, digital filter 23 can be appropriately omitted according to the type of AD converter included in AD conversion part 2.

Summary

AD converter (1) according to a first aspect includes input part (3), AD conversion part (2), first output part (41), and second output part (42). The analog signal output from sensor (101) is input to input part (3). AD conversion part (2) digitally converts an analog signal to generate first digital data and second digital data. First output part (41) outputs the first digital data to control circuit (200). Second output part (42) outputs the second digital data to test controller (301) before first output part (41) outputs the first digital data. In the test mode, test controller (301) determines whether or not sensor system (100) including sensor (101) is in an abnormal state on the basis of the second digital data.

According to this aspect, since the second digital data having a low latency can be output to test controller (301), the time for the test processing in test controller (301) can be reduced.

In AD converter (1) according to a second aspect, in the first aspect, the second digital data has a smaller number of bits than the first digital data.

According to this aspect, the latency of the second digital data can be further reduced.

In AD converter (1) according to a third aspect, in the first or second aspect, AD conversion part (2) includes first AD converter (21) and second AD converter (22) connected in series, and digital filter (23). Second AD converter (22) is provided at a preceding stage of first AD converter (21), and generates second digital data. First AD converter (21) is a ΔΣ type AD converter. Digital filter (23) generates first digital data by filtering an output of first AD converter (21).

According to this aspect, the resolution of the first digital data can be further improved.

In AD converter (1) according to a fourth aspect, in the third aspect, second AD converter (22) is a successive approximation type AD converter.

According to this aspect, the latency of the second digital data can be further reduced.

In AD converter (1) according to a fifth aspect, in the third aspect, second AD converter (22) is a flash type AD converter.

According to this aspect, the latency of the second digital data can be further reduced.

In AD converter (1) according to a sixth aspect, in the first or second aspect, AD conversion part (2) includes AD converter (24) and digital filter (23). AD converter (24) generates second digital data, which is multi-bit digital data, and outputs the second digital data to second output part (42) and digital filter (23). Digital filter (23) generates first digital data by filtering an output of AD converter (24).

According to this aspect, the resolution of the first digital data can be further improved.

In AD converter (1) according to a seventh aspect, in the sixth aspect, AD converter (24) is a noise shaping type successive approximation AD converter or a multi-bit ΔΣ AD converter.

According to this aspect, the latency of the second digital data can be further reduced.

Sensor system (100) according to an eighth aspect includes AD converter (1) according to any one of the first to seventh aspects and sensor (101).

According to this aspect, it is possible to reduce the time for the test processing in test controller (301).

Test system (300) according to a ninth aspect includes sensor system (100) according to the eighth aspect and test controller (301).

According to this aspect, it is possible to reduce the time for the test processing in test controller (301).

INDUSTRIAL APPLICABILITY

The AD converter, the sensor system, and the test system of the present disclosure are industrially useful because the time required for the digital conversion processing can be reduced and the time for the test processing can be reduced.

The invention claimed is:

1. An analog-to-digital converter comprising:
an input part that receives an analog signal output from a sensor;
an analog-to-digital conversion part that digitally converts the analog signal to generate first digital data and second digital data;
a first output part that outputs the first digital data to a control circuit; and
a second output part that outputs the second digital data to a test controller before the first output part outputs the first digital data,
wherein the test controller determines whether or not a sensor system including the sensor is in an abnormal state based on the second digital data in a test mode.

2. The analog-to-digital converter according to claim 1, wherein the second digital data has a smaller bit number than the first digital data.

3. The analog-to-digital converter according to claim 1, wherein
the analog-to-digital conversion part includes a first analog-to-digital converter and a second analog-to-digital converter connected in series, and a digital filter,
the second analog-to-digital converter is provided at a preceding stage of the first analog-to-digital converter, and generates the second digital data,
the first analog-to-digital converter is a ΔΣ type analog-to-digital converter, and
the digital filter generates the first digital data by filtering an output of the first analog-to-digital converter.

4. The analog-to-digital converter according to claim 3, wherein the second analog-to-digital converter is a successive approximation type analog-to-digital converter.

5. The analog-to-digital converter according to claim 3, wherein the second analog-to-digital converter is a flash type analog-to-digital converter.

6. The analog-to-digital converter according to claim 1, wherein
the analog-to-digital conversion part includes an analog-to-digital converter and a digital filter,
the analog-to-digital converter generates the second digital data that is multi-bit digital data, and outputs the second digital data to the second output part and the digital filter, and
the digital filter generates the first digital data by filtering an output of the analog-to-digital converter.

7. The analog-to-digital converter according to claim 6, wherein the analog-to-digital converter is a noise shaping type successive approximation AD converter or a multi-bit ΔΣ analog-to-digital converter.

8. A sensor system comprising:
the analog-to-digital converter according to claim 1; and
the sensor.

9. A test system comprising:
the sensor system according to claim 8; and
the test controller.

* * * * *